United States Patent [19]
Goldblatt et al.

[11] Patent Number: 5,178,914
[45] Date of Patent: Jan. 12, 1993

[54] MEANS OF SEEDING AND METALLIZING POLYMIDE

[75] Inventors: Ronald D. Goldblatt, Rye Brook, N.Y.; Caroline A. Kovac, Ridgefield, Conn.; Domenico Tortorella, Yonkers, N.Y.

[73] Assignee: International Business Machines Corp., Armonk, N.Y.

[21] Appl. No.: 606,015

[22] Filed: Oct. 30, 1990

[51] Int. Cl.$^5$ .................................. C23C 26/00
[52] U.S. Cl. ............................ 427/306; 427/304; 427/305
[58] Field of Search ............... 427/306, 305, 304

[56] References Cited

U.S. PATENT DOCUMENTS

| | | | |
|---|---|---|---|
| 3,928,663 | 12/1975 | Redmond | 427/304 |
| 4,096,043 | 6/1978 | De Angelo | 427/306 |
| 4,261,800 | 4/1981 | Beckenbaugh | 427/305 |
| 4,654,223 | 3/1987 | Araps | 427/96 |
| 4,666,742 | 5/1987 | Takakura | 427/229 |
| 4,775,449 | 10/1988 | Dumas | 427/304 |
| 4,832,799 | 5/1989 | Knudsen | 427/306 |
| 4,931,310 | 6/1990 | Anschel | 427/306 |

FOREIGN PATENT DOCUMENTS 23240  2/1981  European Pat. Off. ............ 427/304

OTHER PUBLICATIONS

Kirk-Othmer "Encyclopedia of Chemical Technology" J. Wiley & Sons 3rd ed. vol. 18, 1982, pp. 706, 707, 711, 716.

Primary Examiner—Shrive Beck
Assistant Examiner—Vi Duong Dang
Attorney, Agent, or Firm—Rosen, Dainow & Jacobs

[57] ABSTRACT

A method for seeding the surface of a polyimide film which has been generated from a precursor polyamic acid film comprising the steps of: generating a film of polyamic acid on a substance (which may be done by conventional spin coating or by other solution coating techniques well known in the art); then either exposing the polyamic acid film to a solution containing palladium cations; heat-treating the palladium-treated film in a time/temperature schedule that causes imidization of the polymer to occur; exposing the seeded film to an electroless plating bath which causes the deposition of blanket metal film on the surface of the polymer film; or curing the film to the polyimide form; mechanically abrading the film surface, exposing the film to a solution containing palladium cations; exposing the seeded film to an electroless plating bath which causes the deposition of blanket metal film on the surface of the polymer film.

36 Claims, No Drawings

MEANS OF SEEDING AND METALLIZING POLYMIDE

DESCRIPTION

1. Technical Field

The present invention relates to a method for seeding the surface of a polyimide film which has been generated from a precursor polyamic acid film to provide a polymeric dielectric suitable for electronic packaging applications wherein the ability to apply metal circuit patterns to said dielectric with satisfactory adhesion is obtained.

2. Prior Art

The use of polymeric dielectrics such as polyimides, polysiloxanes, silicones, cyclobutadienes and other high temperature polymers like polyphenylquinoxaline in semi-conductor technology especially electronic packaging applications is well known. Particularly useful among the aforementioned compositions is the polyimide.

U.S. Pat. No. 3,928,663 discloses a method for rendering a dielectric self-catalytic to deposition of electroless metal in which hectorite is blended with polyimide to form the composite board and the replacable cations in the hectorite are exchanged with a cation of various metals from Groups I-B and VIII of the Periodic Table. An embodiment disclosed herein sanding the surface of the composite board to allow deposition of one of the Group IB or VIII metals from the plating solution at the location where the composite board was sanded.

U.S. Pat. No. 4,666,742 discloses a polymer composition and an organic metal complex uniformly dispersed or dissolved therein. Among the many polymers and metal complexes discloses are polyimide and palladium respectively.

U.S. Pat. No. 4,775,449 discloses a method for improving the adhesion of an applied metal layer to a polyimide surface comprising treatment of the polyimide surface with an adhesion promoting compound having a nitrogen-oxygen moiety prior to plating of metal thereon.

SUMMARY OF THE INVENTION

The present invention relates to methods for seeding and metallizing a polyimide film, generated from a precursor polyamic acid film, using either mechanical or chemical means.

It is an object of the methods of the present invention to render the surface of a polyimide used in the standard electronic packaging applications suitable for the electroless deposition of metal on to the seeded polyimide surface.

In one of the embodiments of the present invention, a polyimide precursor, e.g. a polyamic acid surface is exposed to a seeding medium such as a solution containing palladium cations. The seed treated surface is exposed to heat to imidize the precursor composition. Metal can be electrolessly deposited onto the seeded surface.

Alternatively in the other method comprising the present invention, a polyimide surface is abraded, for example, with sandpaper, and thereafter the treated surface is exposed to a seeding medium which deposits seed in the zero oxidation state. Metal can thereafter be electrolessly plated onto the seeded surface.

DESCRIPTION OF THE INVENTION

In accordance with the present invention, a film of polyamic acid on a substrate is generated using conventional spin coating or by other solution coating techniques well known in the art. The polyamic acid film is exposed to a solution containing palladium cations. The palladium-treated film is heat-treated within a time/temperature schedule that causes imidization of the polymer to occur. The seeded film is then ready thereafter to be exposed to an electroless plating bath which causes the deposition of a blanket metal film on the surface of the polymer.

Alternatively, the method embodies generation of a polyamic acid film on a substrate in the manner disclosed above, curing the film to the polyimide form, and thereupon mechanically abrading the film's surface using sandpaper or some other abrading means to roughen the surface. The film is then exposed to a solution containing palladium cations. The seeded film is thereafter exposed to an electroless plating bath which causes the deposition of a blanket of metal film on the surface of the polymer film.

Polymers which can be satisfactorily used as substrates or dielectrics in accordance with the present invention are selected from the following group:
polyamides
polyesters
polyurethanes
polysiloxanes
phenolics
polysulfides
polyacetals
polyethylenes
polyisobutylenes
polyacrylonitriles
polyvinylchlorides
polystyrenes
polymethylmethacrylates
polyvinylacetates
polytetrafluoroethylenes
polyisoprene
polycarbonates
polyether
polyimides
polybenzimidazoles
polybenzoxazoles
polybenzothiazoles
polyoxadiazoles
polytriazoles
polyquinoxalines
polyimidazopyrrolones
and copolymers containing an aromatic constituent and a constituent selected from a vinyl and cyclobutane group, wherein the aromatic constituent and the vinyl and cyclobutane groups contain at least one element selected from the group comprising Si, Ge, Ti, Zn and Fe as described in copending U.S. patent application Ser. No. 07/366,089 filed Jun. 13, 1989.

The most highly preferred polymers are used in accordance with the present invention polyimide type polymers. Polyimide polymers are described in the Encyclopedia of Chemical Technology, Third Edition in the article entitled "Polyimides" Volume 18, p. 704, the teaching of which is incorporated herein by reference.

Generally, the polyimides include the following recurring unit where the arrows indicate isomerism:

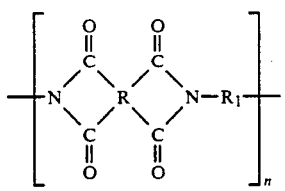

where n is an integer representing the number of repeating units to provide a molecular weight usually in the range of about 10,000 to about 100,000. R is at least one tetravalent organic radical selected from the group consisting of:

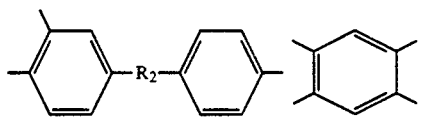

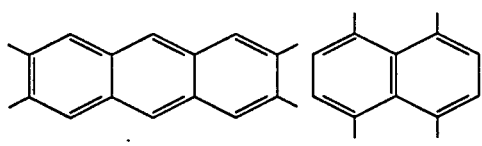

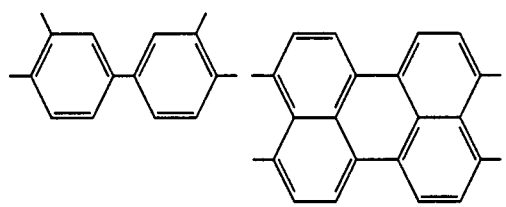

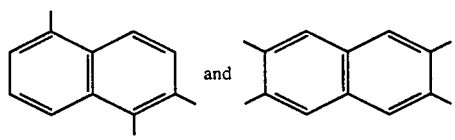

$R_2$ being selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals and in which $R_1$ is at least one divalent radical selected from the group consisting of an aliphatic organic radical or from the group shown:

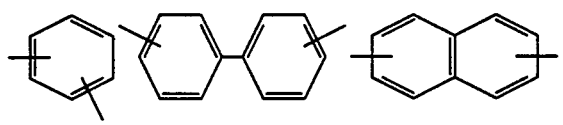

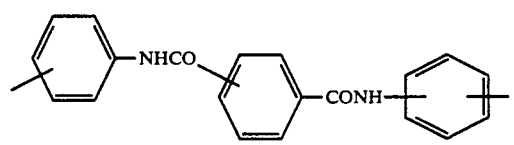

and

-continued

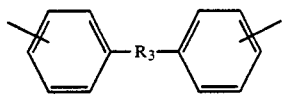

in which $R_3$ is a divalent organic radical selected from the group consisting of $R_2$, silicon, and amino radicals. Polymers containing two or more of the R and/or $R_1$ radicals, especially multiple series of $R_1$ containing amino radicals, can be used.

Polyimides are available commercially from a wide variety of suppliers in one of three forms: a) as solutions of the polyamic acid precursors (e.g., DuPont Pyralin); as pre-imidized polyimide form (e.g., DuPont Katpon film); or c) as pre-imidized powders (e.g., Ciba-Geigy Matrimid 5218) or solutions (e.g., Ciba-Geigy Probimide). The chemistry of commercial polyimides includes examples of many of the components listed above, but a preferred polymer for use pursuant to the present invention is based on the monomers pyromellitic dianhydride (PMDA) and oxydianiline (ODA), also named 4,4'-diaminodiphenyl ether. Other preferred polymers for use pursuant to the present invention are the polymers of benzophenonetetracarboxylic dianhydride (BTDA) and ODA and/or 1,3-phenylenediamine and polymer of 3,3'-biphenylenediamine (PDA).

Polyimide films based on PMDA-ODA are available from Allied Corporation under the trade name Apical and from DuPont under the trade name Kapton. Films based on BTDA-PDA are available from UBE Corporation as Upilex and from Hitachi Chemical Company in solution form as PIG-L100. Other trade name polyimides useful pursuant to the present invention include Durimide from Rogers Corporation and the DuPont Pyraline series, including PI-2525 and PI-2566.

It is known that the direct production of high molecular weight aromatic polyimides in a one-stage polymerization cannot be accomplished because the polyimides are insoluble and infusible. The difficulty is that the polymer chains precipitate from the reaction media (regardless of whether solution or melt) before high molecular weights are obtained. Polyimides are, therefore synthesized by a two-stage process. The first stage involves an amidation reaction carried out in a polar solvent such as N, N-dimethylacetamide, N,N-dimethylformamide, dimethyl sulfoxide, or N-methyl-2-pyrrolidone to produce a high molecular weight polyamic acid.

A typical reaction is as follows:

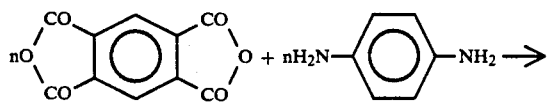

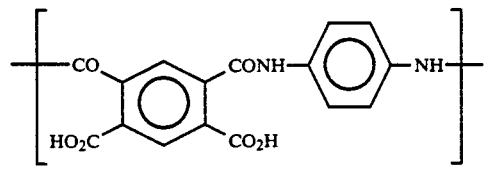

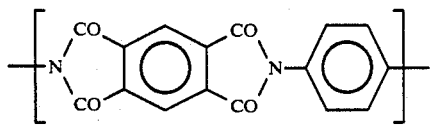

Processing of the polymer can only be accomplished after the first stage, at which point it is still soluble and fusible. The polymer is insoluble and infusible after the second stage of the process. The polyamic acid is formed into the desired physical form of the final polymer product (i.e. a film) and the second stage of the reaction is carried out. The polyamic acid is cyclized in the solid state to the polyimide by heating at moderately high temperatures above 150° C. The polymer is kept in a solution during the amidation reaction by using mild conditions i.e. temperatures of 70° C. or below so as to keep the amount of cyclization to a minimum.

The amides which are of use in the present invention comprise polyether imides, polyamides, polyisoimidazole and poly isoindoloquinazolindione. It has been determined that high temperature ladder or ladder type i.e. semi-ladder polymers such as polyimidazopyrroles are useful.

In accordance with one embodiment of the present invention a polyamic acid of suitable thickness is deposited on a substrate which can conveniently be copper or some other metal. The polymer is dried at a low temperature, i.e. between 50° C. and 150° C. to a weight percent solids in the range of 20% to 100% at 10% to 100% amic acid. The resultant composite is contacted with an aqueous metal cation solution, for example palladium nitrate, at a concentration range of 0.001 to 10 mg/ml for suitable time to allow seeding of a polymer for example any where from 30 seconds to 45 minutes, preferably 1 to 5 minutes. The resultant treated product is rinsed in water for sufficient time to remove impurities. This rinsing step can be for as long as 60 minutes but is usually between 1 and 5 minutes. The product is then placed in a room-temperature oven and then heated to a temperature of from about 180° to 225° for sufficient time to induce imidization. The temperature in the oven is usually ramped to about 225° C. to induce imidization. The dwell time for such treatment in the room-temperature oven ranges between 5 minutes and 1 hour usually around 15 minutes.

The composite is then plated in any of the standard commercially available electroless baths for anywhere from 30 seconds to 5 minutes, preferably about 2 minutes. The plated product is rinsed in flowing water for a period of from 1 to 60 minutes and is thereupon baked for 0.5 to 24 hours at temperature ranging from between about 85° C. and 100° C. The treated composite is then ready to be electroplated in the standard acidic cupric sulfate electroplating bath.

In the alternative embodiment of the present invention a PMDA-ODA polyimide of suitable thickness double clad on two ounce copper fully cured, is abraded using any convenient means such as sandpaper. The extent of the mechanical abrasion of the polyimide surface should be sufficient to allow formation of surface chemical species which will complex metal cations when exposed thereto. The abraded polymer surface is then cleaned with water using, if desired, an ultrasonic water tank. It is then seeded in an aqueous metal solution, for example palladium nitrate, at a concentration range of 0.001 to 10 mg/ml for a period of about 30 seconds to about 45 minutes. The seeded polymer is then rinsed in water for sufficient time to remove impurities and is thereupon ready to be plated in the standard electroless copper bath for a period of 30 seconds to 5 minutes generally 2 minutes. After the electroless treatment the product is rinsed in water for up to 5 minutes, or whatever time is sufficient to remove impurities.

The parts prepared in accordance with the embodiments described above, seed and plate efficiently and effectively and the adhesion of the plated metal is such that no failure is observed with the standard scotch tape peel test after 90 minutes in the electroless bath.

The processes described herein have obvious uses in any application where is desirable to metallize a polyimide film especially a polyimide film that was supplied as a polyamic acid film and thermally imidized. The methods described herein have advantages over those existing in the prior art in that they easily processed and do not require the special handling apparatuses and treatments, such as dry box atmosphere, vacuum depositions, plasma treatments as are required in the prior art.

DETAILED DESCRIPTION OF THE PREFERRED EMBODIMENT OF THE INVENTION

The preferred embodiment of the invention can be illustrated by means of the following examples.

EXAMPLE 1

A sample of an imide polymer designated polyimide 2525 having a thickness of 0.00508 cm which was double clad on two ounce copper, was dried at low temperature to 69 weight percent solids at 94% amic acid. The product was seeded in an aqueous palladium nitrate solution having 1 mg/ml concentration for about 45 minutes. The seeded product was rinsed in flowing water for 60 minutes then placed in a room-temperature oven and ramped to 225° C. for a dwell time of 15 minutes. The product was then plated in a standard room-temperature copper electroless bath for 2 minutes, rinsed in flowing water for 60 minutes and baked for 24 hours at 85° C. The product was then electroplated in a standard acidic cupric sulfate electroplating bath at 4 mA/cm$^2$ to a thickness of 0.0003175 cm. The electroplated product was rinsed in flowing water for 60 minutes and bakes for 24 hours at 85° C. A ninety degree peel test was performed and it was determined that the peel strength equaled 35±7 g/mm for 2,3 and 4 mm peel lines.

EXAMPLE 2

A PMDA-ODA polyimide having a thickness of 0.00508 cm double clad on 2 ounce copper, fully cured was sanded with 400 grit sandpaper and the surface so treated was cleaned in an ultrasonic water tank. The polyimide having the abraded surface was seeded by contacting same in an aqueous palladium nitrate solution having a concentration of 0.1 g/ml for 1 minute. The product is then rinsed in water for about 5 minutes and plated in the standard room-temperature electroless copper bath for a period of about 90 minutes. The electrolessly plated composite is rinsed in water for 5 minutes and is then suitable for electroplating in a standard acidic cupric sulfate electroplating bath at 40 mA/cm$^2$ to a thickness of about 0.0003175 cm.

While the invention has been particularly shown and described with respect to the preferred embodiments set forth above, it will be understood by those skilled in the art that the foregoing and other changes in form and details may be made therein without departing from the spirit and scope of the invention.

Having thus described our invention, what we claim as new, and desire to secure by Letters Patent is:

1. The method of seeding the surface of a polyimide film to render it suitable for electroless metal deposition thereon comprising:
   a) generating a film of polyamic acid on a substrate;
   b) contacting said polyamic acid film with a solution containing palladium cations;
   c) exposing said palladium treated polyamic film to a temperature for a time sufficient to cause imidization of said polyamic acid to occur; and
   d) exposing the resulting polyimide film containing said palladium to an electroless plating bath to obtain deposition of a blanket metal film thereon.

2. The method of seeding the surface of a polyimide film to render it suitable for electroless metal deposition thereon comprising:
   a) generating a film of polyamic acid on a substrate;
   b) exposing said polyamic acid film to a temperature for a time sufficient to cause imidization of said polyamic acid to occur;
   c) mechanically abrading the surface of the resulting polyimide film;
   d) contacting said polyimide film with a solution containing palladium cations; and
   e) exposing the polyimide film containing said palladium to an electroless plating bath to obtain deposition of a blanket metal film thereon.

3. The method defined in claim 1 or 2 wherein the polyimide includes the following recurring unit:

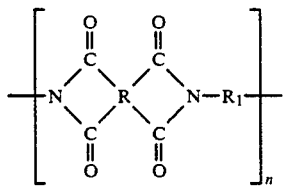

wherein n is an integer representing the number of repeating unit to provide a molecular weight in the range of about 10,000 to about 100,000, R is at least one tetravalent organic radical selected from the consisting of:

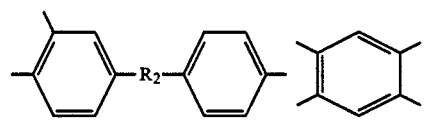

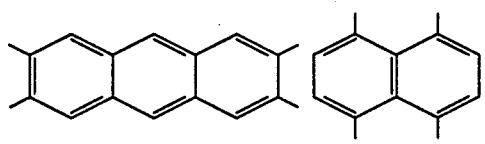

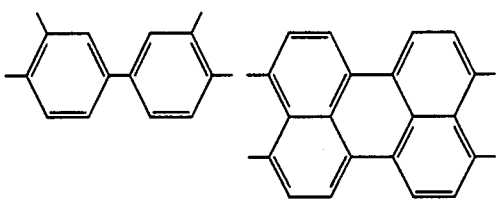

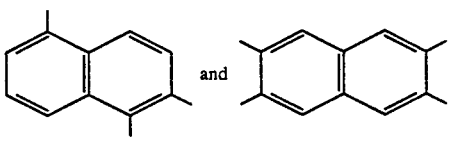

$R_2$ being selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals and in which $R_1$ is at least one divalent radical selected from the group consisting of an aliphatic organic radical or from the group shown:

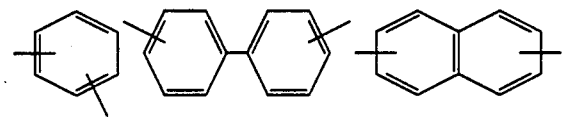

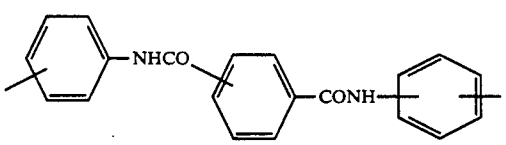

and

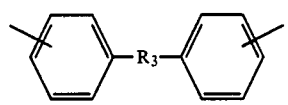

in which $R_3$ is a divalent organic radical selected from the group consisting of $R_2$, silicon, and amino radicals.

4. The method defined in claim 1 wherein said polyimide is formed based upon pyromellitic dianhydride and oxydianiline monomers.

5. The method defined in claim 1 wherein said polyimide is formed based upon benzophenonetetracarboxylic dianhydride and oxydianiline and monomers.

6. The method defined in claim 1 wherein said polyimide is formed based upon benzophenonetetracarboxylic dianhydride and oxydianiline and 1,3-phenylenediamine monomers.

7. The method defined in claim 1 wherein said polyimide is formed based upon benzophenonetetracarboxylic dianhydride and 1,3'-biphenylenediamine monomers.

8. The method defined in claim 1 wherein said polyimide is formed based upon benzophenonetetracarboxylic dianhydride and polymer of 3,3' biphenylenediamine.

9. The method defined in claim 3 wherein the reaction to form the polyamic acid is carried out in a polar solvent selected from the group consisting of N,N- dimethylacetamide, N,N-dimethylformamide, dimethyl sulfoxide or N-methyl-2-pyrrolidone.

10. The method defined in claim 9 wherein said polyamic acid is cyclized in the solid state into said polyimide at temperatures of 150° and above.

11. The method defined in claim 10 wherein said polyamic acid is deposited on suitable metal substrate.

12. The method defined in claim 11 wherein said metal is copper.

13. The method defined in claim 12 wherein said polymer is dried at a temperature between about 50° C. and 150° C. to a weight percent solids in the range of about 20% to 100% at 10% to 100% amic acid.

14. The method defined in claim 13 wherein the solution containing a palladium compound is a palladium nitrate at a concentration range of 0.001 to 10 mg/ml for a period of time ranging from about 30 seconds to about 45 minutes.

15. The method defined in claim 14 wherein said film treated with said palladium nitrate is washed with water for a period up to about 60 minutes.

16. The method defined in claim 15 wherein imidization is induced by heating said polyamic acid to a temperature of from about 180° to about 225° C. for between about 5 minutes and 1 hour.

17. The method defined in claim 16 wherein said heating is done for about 15 minutes.

18. The method defined in claim 17 wherein the electroless plating is conducted for between about 30 seconds and 5 minutes.

19. The method defined in claim 18 wherein the electroless plating is conducted for about 2 minutes.

20. The method defined in claim 19 wherein the electrolessly plated product is rinsed with flowing water for a period of from about 1 minute to about 60 minutes and thereafter dried for a period of about 30 minutes to 24 hours at a temperature between about 85° C. and 100° C.

21. The method defined in claim 2 wherein said mechanical abrasion is sufficient to allow formation of surface chemical species that will complex metal ions when exposed thereto.

22. The method defined in claim 21 wherein said polyimide is formed, based upon pyromellitic dianhydride and oxydianiline monomers.

23. The method defined in claim 21 wherein said polyimide is formed, based upon benzophenonetetracarboxylic dianhydride and oxydianiline and monomers.

24. The method defined in claim 21 wherein said polyimide is formed, based upon benzophenonetetracarboxylic dianhydride and oxydianiline and 1,3-phenylenediamine monomers.

25. The method defined in claim 21 wherein said polyimide is formed, based upon benzophenonetetracarboxylic dianhydride and 1,3-phenylenediamine monomers.

26. The method defined in claim 21 wherein said polyimide is formed, based upon benzophenonetetracarboxylic dianhydride and the polymer of 3,3' diphenylenediamine.

27. The method defined in claim 21 wherein said abrasion is conducted with sandpaper.

28. The method defined in claim 27 wherein the abraded polymer surface is washed with water.

29. The method defined in claim 28 wherein said washing step is carried out in an ultrasonic water tank.

30. The method defined in claim 28 wherein said polyamic acid is deposited on metal substrate.

31. The method defined in claim 30 wherein said metal is copper.

32. The method defined in claim 30 wherein the solution containing a palladium compound is a palladium nitrate solution having a concentration range of from about 0.001 to 10 mg/ml and is held in contact with said film form a period of time ranging from about 30 seconds to 45 minutes.

33. The method defined of claim 32 wherein said film treated with said palladium nitrate is washed with water for a period up to 5 minutes.

34. The method defined in claim 33 wherein the electroless plating is conducted for a period of between about 30 seconds and 5 minutes.

35. The method defined in claim 34 wherein the electroless plating is conducted for about 2 minutes.

36. The method defined in claim 35 wherein the electrolessly plated product is rinsed with water for a period of from about 1 to 60 minutes and thereafter dried for a period of about 30 minutes to 24 hours at temperatures between about 85° C. and 100° C.

* * * * *